United States Patent
Schedel et al.

(10) Patent No.: US 7,304,716 B2
(45) Date of Patent: Dec. 4, 2007

(54) METHOD FOR PURGING AN OPTICAL LENS

(75) Inventors: Thorsten Schedel, Dresden (DE); Sebastian Schmidt, Dresden (DE); Günter Hraschan, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 232 days.

(21) Appl. No.: 11/127,304

(22) Filed: May 12, 2005

(65) Prior Publication Data

US 2005/0269748 A1    Dec. 8, 2005

Related U.S. Application Data

(63) Continuation of application No. PCT/DE03/03720, filed on Nov. 10, 2003.

(30) Foreign Application Priority Data

Nov. 14, 2002    (DE) ................. 102 53 162

(51) Int. Cl.
*G03B 27/52* (2006.01)
*G03B 27/42* (2006.01)

(52) U.S. Cl. .................. 355/30; 355/53; 355/55

(58) Field of Classification Search ............ None
See application file for complete search history.

(56) References Cited

U.S. PATENT DOCUMENTS

| | | | | |
|---|---|---|---|---|
| 3,696,230 | A * | 10/1972 | Friedrich | 219/121.75 |
| 3,850,593 | A * | 11/1974 | Beaujean et al. | 62/625 |
| 6,496,257 | B1 * | 12/2002 | Taniguchi et al. | 356/239.2 |
| 6,509,567 | B2 * | 1/2003 | Boudet et al. | 250/345 |
| 6,545,746 | B1 * | 4/2003 | Nishi | 355/53 |
| 6,571,057 | B2 * | 5/2003 | Aoki | 396/53 |
| 6,671,033 | B2 * | 12/2003 | Akagawa et al. | 355/30 |
| 6,781,685 | B2 * | 8/2004 | Hamm | 356/237.1 |
| 2001/0043321 | A1 * | 11/2001 | Nishi et al. | 355/67 |
| 2001/0055099 | A1 * | 12/2001 | Akagawa et al. | 355/30 |
| 2002/0050567 | A1 * | 5/2002 | Boudet et al. | 250/345 |
| 2002/0109826 | A1 * | 8/2002 | Akagawa et al. | 355/53 |

(Continued)

FOREIGN PATENT DOCUMENTS

EP    1026549    9/2000

(Continued)

*Primary Examiner*—Patrick Assouad
*Assistant Examiner*—Warren K Fenwick
(74) *Attorney, Agent, or Firm*—Edell, Shapiro & Finnan, LLC

(57) ABSTRACT

By a unit for determining fractions of a substance in a gas or gas mixture, measurements are carried out on the gas or gas mixture for purging a lens in a projection apparatus for projecting patterns onto a substrate. The results of a first measurement on the gas fed to the lens are compared with the results of a measurement of the gas removed from the lens. If, the substance is a contaminating substance that leads to a deposit on the lens under the influence of high-energy radiation from an illumination source, the difference is used to infer photochemical reactions on the surface of the lens that lead disadvantageously to the deposition. A signal is generated as a consequence of the comparison and is used to take preventive measures against a degradation of the lens. Mass spectrometers, electric or optical sensors and other known methods for substance analysis are used as measurement units.

24 Claims, 1 Drawing Sheet

U.S. PATENT DOCUMENTS

| | | |
|---|---|---|
| 2002/0145711 A1* | 10/2002 | Magome et al. .............. 355/30 |
| 2003/0011763 A1* | 1/2003 | Taniguchi et al. ....... 356/239.2 |
| 2003/0151728 A1* | 8/2003 | Nishi .......................... 355/30 |
| 2004/0008328 A1* | 1/2004 | Akagawa et al. ............. 355/30 |
| 2004/0114121 A1* | 6/2004 | Nishi et al. ................... 355/67 |
| 2004/0238745 A1* | 12/2004 | Pedersen et al. ............ 250/343 |
| 2006/0044562 A1* | 3/2006 | Hagene et al. .............. 356/437 |

FOREIGN PATENT DOCUMENTS

| | | |
|---|---|---|
| EP | 1143491 A1 | 10/2001 |
| WO | WO 03/058213 A1 | 7/2003 |

* cited by examiner

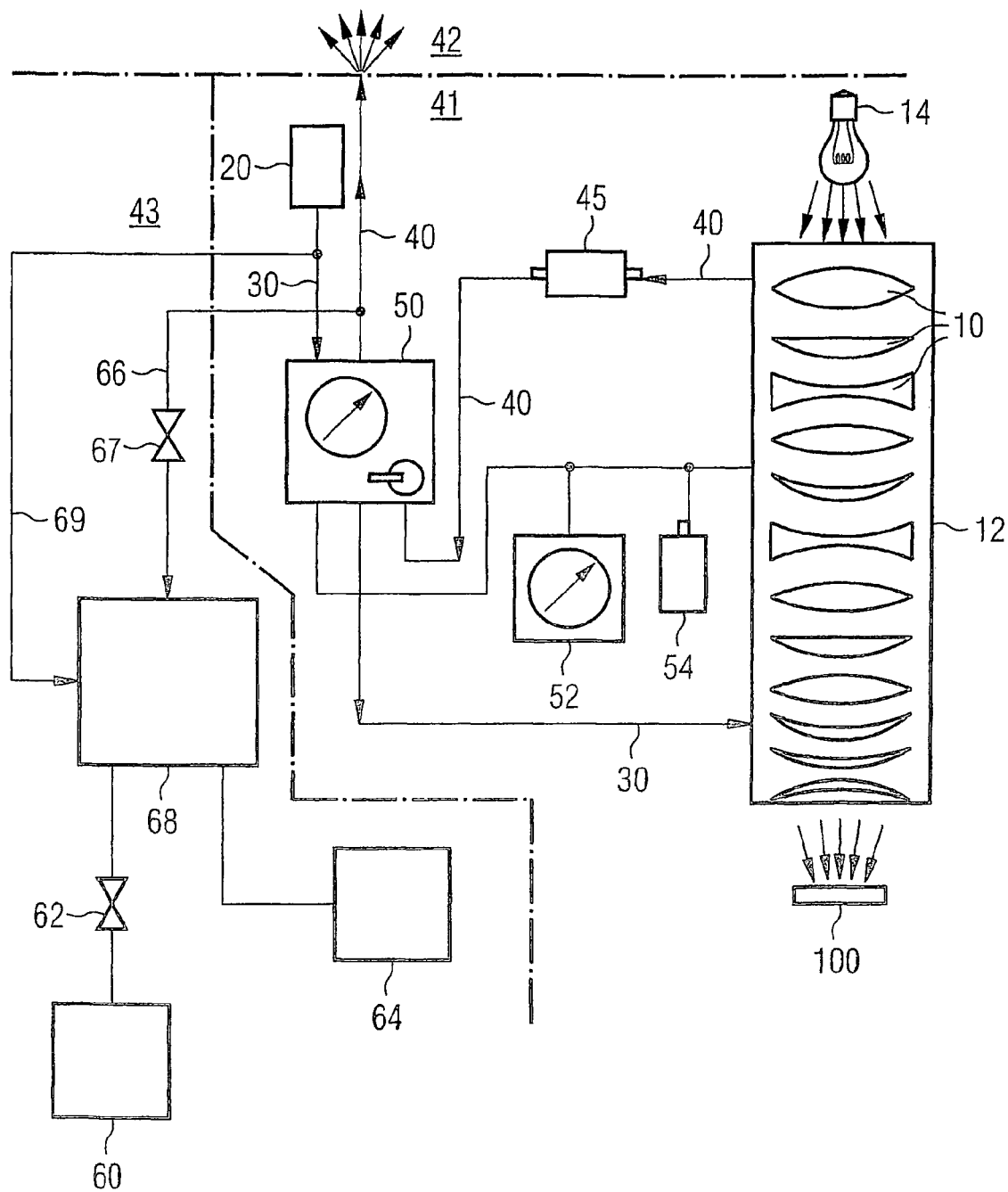

METHOD FOR PURGING AN OPTICAL LENS

CROSS REFERENCE TO RELATED APPLICATIONS

This application is a continuation of PCT/DE03/03720, filed Nov. 10, 2003, and titled "Method for Washing an Optical Lens," which claims priority to German Application No. DE 10253162.5, filed on Nov. 14, 2002, and titled "Method for Washing an Optical Lens," the entire contents of each are hereby incorporated by reference."

FIELD OF THE INVENTION

The present invention relates to a method for purging an optical lens in a projection apparatus for exposing a substrate coated with a photosensitive resist by a gas or gas mixture in order to avoid deposits on the lens.

BACKGROUND

When producing semiconductors to project structures onto a substrate coated with a photosensitive resist, it is customary to use lens systems that are assembled from a multiplicity of individual lenses. The lens project the patterns transirradiated by light of a mask into the photosensitive resist with high contrast. In order to avoid instances of contamination, these lens systems are sealed in an airtight fashion in housings and are purged, for example, with dried air of high purity or with nitrogen. These gases or gas mixtures hardly interact with the lens material, and undesired depositions on the lens surface can be avoided.

However, instances of lens degradation occur evermore frequently, after lengthy use of the lenses, for example, in exposing semiconductor wafers by projecting patterns at wavelengths of, for example, 365 nm and lower. Reasons for this may reside in internal or external sources of contamination. Internal sources of contaminating gas or gas mixtures are, for example, oils or sealing rings that are used in assembling the lens systems in the housings and gradually degas.

External sources are, for example, caused by the clean room air, which is not entirely free of contamination, in the neighborhood of the projection apparatuses, for example, wafer steppers or scanners. The tightness of the lens housings and of the feed lines can lessen with time, while the substances can also pass from the neighborhood into the sources of gas or gas mixture provided for the purging.

Due to transition of the wavelengths used for exposure from 365 nm (i line) in the past to 248 nm (KrF), 193 nm (ArF), 157 nm (F2) and even shorter wavelengths, there is also a rise in the energy throughput through the lenses. In particular, the interactions, induced by energy, between the lens surface and the surrounding gases will increase further in the future, thus requiring greater attention to be paid to depositions, and therefore to effects of turbidity and degradation of the lens. The action of degraded lenses can consist in the disappearance or the falling over of paths in the photoresist layers, or else in the occurrence of remains of photoresist residues. The effects manifesting themselves in lens aberrations are difficult to qualify, and therefore lead by the time the problems are detected to a high level of product losses (loss in yield).

The oils are burnt in, for example, by high-energy radiation as extended spots on the lens surfaces. In the case of CaF lenses for use of wavelengths at 193 nm, turbidity effects are known that lead, through photochemical reactions of the gas mixture, to the formation of sulfur- or phosphorus-containing salts on the lens surface.

To recognize these problems at an early stage, inline tests in which samples of semiconductor wafers coated with a photosensitive resist have been exposed with the aid of one or more test reticules or test masks have been used. Establishing a shift in focus, possibly as a function of the pattern sizes, has been an indication of increasing degradation of the lens based on instances of contamination in the gases or gas mixtures being fed for purging the lenses. These tests require valuable equipment time and permit errors to be detected only in retrospect.

Detection and prevention of lens degradations at an early stage is desirable. Also, an increase in the production yield of semiconductors, and improved the productivity of a projection apparatus for exposing substrates are desirable.

SUMMARY

A method for purging an optical lens in a projection apparatus for exposing a substrate coated with a photosensitive resist by a gas or gas mixture in order to avoid deposits on the lens includes providing a source for the gas or gas mixture, conveying the gas or gas mixture through a first line from the source to the lens in the projection apparatus, conducting a first measurement of at least a first fraction of a substance of the gas or gas mixture in the first line, purging the lens, removing the gas or gas mixture from the lens by a second line into a neighborhood of the projection apparatus, conducting a second measurement of at least a second fraction of the substance of the gas or gas mixture in the second line, comparing the first fraction with the second fraction, and generating a signal as a function of the result of comparison.

Further, an arrangement for projecting a pattern onto a substrate coated with a photosensitive resist including at least one lens arranged inside a housing sealed in a substantially airtight fashion, an illumination source, a source for a gas or gas mixture for purging the lens, a first line for feeding the gas or gas mixture to the lens that connects the source and the interior of the housing, a second line for removing the gas or gas mixture from the lens that connects the interior of the housing and a neighborhood of the arrangement to a control unit for controlling the flow of the gas or gas mixture into the interior of the housing, and a unit for measuring the fraction of a substance of the gas or gas mixture connected to the second line.

In accordance with the present invention, the gas or gas mixture flowing off during the purging operation from the housing includes a lens system with a multiplicity of individual lenses examined for fractions of substances to infer the gas reactions proceeding in the interior of the housing, i.e., on the lens surface, or photochemical conversion reactions. During this investigation, specific substances in the gas or gas mixture are examined as a fraction in terms of quantity or volume, molar fraction, or as a complete breakdown, i.e., to measure the substances in the gas or gas mixture.

Instead of a precise constituent fraction, the measurement also includes checking whether or not a specific threshold value for the fraction has been exceeded.

The substances are materials suspected of contamination, such as oils, water, gas emissions from plastics, or materials normally used in clean rooms for carrying out chemical processes. The materials can be present as gases, gas mixtures, aerosols, vapor, suspended particles, etc., in the purging gas or gas mixture, etc.

The fraction of the substance or substances in the gas or gas mixture flowing in is likewise measured as reference value for a measurement. This reference value is compared with the measured value in the gas flowing out. If a difference results in the comparison, this shows that chemical, in particular, photochemical reactions have taken place in the housing enclosing the lenses. The first measurement of the fraction in the gas flowing in can also be carried out, according to the invention at relatively large intervals or once for a system setup. This is advantageous, in particular, whenever only one measurement unit is available for measuring the fraction of the substance in the gas or gas mixture, such that it is not necessary to constantly switch over the connection to the feed lines or drain lines for each cycle of the method according to the invention.

When a concrete container for gas or gas mixture is provided as source for the gas flowing in to purge the lenses, there is no change in the composition in the container, and so the first measurement needs to be carried out once.

If the difference of the substance fraction in the gas flowing in or off, respectively, exceeds a specific threshold value that can be obtained empirically, a signal is generated that is used in accordance with further refinements of the present invention for the initiating actions with the aid of which the degradation of the lens can be avoided. These include, for example, interruption of the current production in the projection apparatus in order to investigate the causes based on the contaminating substance was able to reach the interior of the purging system. The signal can also be used to initiate the exchange of the lens or of the entire housing. This applies, in particular, whenever it is certain that internal sources such as outgassing sealing rings or oils are the cause of the contamination.

The method according to the invention can also be used in particular, when the housing with the lens system has been opened in order to undertake work on the system, for example, exchanging a lens, such that external gases or gas mixtures are present inside the housing shortly after this operation. In order to establish how long it is necessary to purge until these remains are removed from the housing, the gas flowing out with the gas flowing in are compared. In the case of highly pure, dried air as purging gas mixture, there is the danger, to be precise, that an air mixture still present from the clean room neighborhood with a high water fraction remains in the lens system shortly after the opening. Traces of moisture in the air mixture rank, however, as the cause of the formation of the salts on the lens surfaces. Thus, according to the invention it is possible to compare with one another measurements of the substance fractions of oxygen and water ($H_2O$) in the gas or gas mixture flowing in or flowing out, respectively. In accordance with the prior art, it would only be possible here to determine the point in time at which production is resumed, that is to say the exposure of wafers, based on the empirical values.

BRIEF DESCRIPTION OF THE DRAWING

The invention will now be explained in more detail using an exemplary embodiment and with the aid of a drawing, in which:

FIG. 1 shows a schematic illustration of an arrangement for purging a lens of a projection apparatus in accordance with an exemplary embodiment of the present invention.

DETAILED DESCRIPTION

An exemplary embodiment of the present invention of FIG. 1, illustrates an arrangement for purging a lens in a lens system of a projection apparatus 41 for exposing semiconductor wafers 100. The components of the projection apparatus 41 are seen on the right-hand side of FIG. 1. An illumination source 14 emits light of wavelength 193 nm (ArF laser), which is focused by a system of lenses 10 in a photosensitive resist applied to the semiconductor substrate 100. A mask with patterns and additional lenses arranged between the illumination source 14 and the lenses 10 are not shown. The transparently constructed patterns on the mask are transirradiated by a parallel light bundle calibrated with the aid of the additional lens.

The present invention further includes exposure and projection arrangements in which sharply focused laser beams are projected directly onto the substrate without transillumination of a mask via the lens system. For example, with the exposure of photosensitive resists on masks or reticules. Control of a purging operation of the present invention can also be applied with this arrangement.

The individual lenses 10 of the lens system are arranged in a substantially airtight housing 12. A gas container 20 filled with nitrogen is used as source for the purging gas. The nitrogen gas or to the extent that further gas additives are used the nitrogen gas mixture, is led into the housing 12 with the lenses 10 via feed lines 30. This operation is controlled by a control unit 50 for the throughflow of gas. The control unit 50 is connected to a manometer 52 and a barometer 54 that can be used, inter alia, to measure the gas pressure, the temperature, etc., within the housing 12. This arrangement defines a control circuit that substantially ensures constant physical conditions inside the housing 12. The nitrogen gas bathes the lenses 10 and leaves the housing 12 via a second line (drain line) 40. It is cleaned by a carbon filter 45, for example. The gas or gas mixture is controlled by the control unit 50 when flowing off. In the present exemplary embodiment, the gas or gas mixture is led via the second line 40 from the projection apparatus 41 into the surrounding clean room 42 of the projection apparatus 41.

Further features and components described below can be included as an integral part of the projection apparatus or a separate module to be coupled on. For example, with a separate module, mobile use in a semiconductor production with a multiplicity of projection apparatuses is permitted. For this purpose, a standardized interface for each projection apparatus to which the additional module can be coupled is available.

The second line 40, which removes the gas, is connected to a detection chamber 68 via a line 66. The incoming flow, from the second line 40 into the detection chamber 68, of the gas to be removed is controlled with the aid of a first valve 67. The detection chamber 68 includes a plurality of sample chambers in which gas samples are successively introduced from the second line 40 in a time controlled fashion in each case. Gas samples are taken by a vacuum pump 64 connected to the detection chamber 68. Via a second valve 62, the individual, intermediately stored gas samples are fed to a mass spectrometer 60 for measuring the mass fraction of individual substances, such as, the water fraction. Control of the valves 67, 62 and the vacuum pump 64, the individual sample chambers in the detection chamber 68, and of the measurement in the mass spectrometer 60 are coordinated with the aid of a second control unit (not shown in FIG. 1). This second control unit is preferably coupled to a database in which the measured substance fractions are stored and assigned to the extraction times from the second line 40.

Analyses can be applied to the time series thereby determined, and can be used to determine temporally localized events and to predict trends and thus future overshootings of threshold value.

The detection chamber 68 is also connected, via a further line 69, to the first line 30 for feeding nitrogen from the gas container 20 into the housing 12 with the lenses 10. To carry out the first reference measurement of the gas, which is assumed not to be contaminated, the gas is introduced at relatively long intervals into one of the sample chambers and immediately or later fed via the valve 62 to the mass spectrometer 60 for determining the fractions of the same substances, i.e., the water fraction.

Further electric or optical sensors are connected to the detection chamber 68 in parallel with the mass spectrometer 60 with the valve 62 by means of further valves, for the purpose of determining the substance fractions, further known methods for substance analysis also being incorporated by the invention. It is also possible, however, for the gas fed to the sensors subsequently to be fed back again into the first lines 30 or second lines 40 for further use during purging.

The dashed and dotted lines illustrated in FIG. 1 separate the modules having the projection apparatus 41. The additional module 43 for carrying out the comparative measurement can be coupled to the projection apparatus 41 and the surrounding clean room 42.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE NUMERALS

10 Lens
12 Housing for lens system
14 Illumination source, laser
20 Gas container for purging gas
30 First line, feed line for feeding purging gas to the lens
40 Second line, drain line for draining purging gas from the lens
41 Projection apparatus
42 Clean room environment for the projection apparatus
43 Additional module for measuring substance fractions in the purging gas or gas mixtures
45 Carbon filter
50 Control unit for throughflow of gas
52 Manometer
54 Barometer
60 Mass spectrometer, electric or optical sensors
62 Second valve
64 Vacuum pump
66 Connecting line for removing gas
67 First valve
68 Detection chamber
69 Connecting line for removing gas
100 Substrate coated with photosensitive resist, wafer, flat panel, mask

What is claimed is:

1. A method for purging a gas or gas mixture from an optical lens in a projection apparatus, comprising:
   conveying the gas or gas mixture through a first line to the optical lens in the projection apparatus;
   conducting a first measurement of at least a first fraction of a substance of the gas or gas mixture in the first line;
   purging the gas or gas mixture from the optical lens;
   removing the gas or gas mixture from the lens via a second line;
   conducting a second measurement of at least a second fraction of a substance of the gas or gas mixture in the second line;
   comparing the first fraction with the second fraction; and
   generating a signal as a function of the result of comparison.

2. The method as claimed in claim 1, wherein the projection apparatus includes an illumination source which radiates light with a wavelength of 193 nanometers or less through the lens onto a substrate.

3. The method as claimed in claim 1, wherein the lens is exchanged for a second lens as a consequence of the generated signal.

4. The method as claimed in claim 1, wherein the first measurement is carried out using at least one optical detector.

5. The method as claimed in claim 1, wherein the first measurement is carried out using at least one or more electric sensor.

6. The method as claimed in claim 1, wherein the first measurement is carried out using a mass spectrometer.

7. The method as claimed in claim 6, wherein removing the gas or gas mixture from the lens, includes taking samples at predetermined time intervals, samples being stored in respective separate chambers, the samples being provided to the mass spectrometer for carrying out the second measurement.

8. The method as claimed in claim 1, wherein the method is executed immediately after an exchange or cleaning operation of the lens.

9. The method as claimed in claim 8, wherein generating a signal includes exposing a substrate.

10. An arrangement for projecting a pattern onto a substrate comprising:
    at least one lens arranged inside a housing sealed in a substantially airtight fashion;
    an illumination source;
    a source for a gas or gas mixture for purging the lens;
    a first line for feeding the gas or gas mixture to the lens, the first line connecting the source and the interior of the housing;
    a second line for removing the gas or gas mixture from the lens;
    a control unit for controlling the flow of the gas or gas mixture into the interior of the housing; and
    a measurement unit for performing a first measurement of a fraction of a substance of the gas or gas mixture in the first line and for performing a second measurement of a fraction of the substance of the gas or gas mixture in the second line, wherein the control unit compares the second measurement to the first measurement, which serves as a reference, to determine whether the gas or gas mixture removed from interior of the housing is sufficiently free of contamination.

11. The arrangement as claimed in claim 10, further comprising:
    a detection chamber for accommodating the gas or gas mixture for a measurement, the detection chamber being arranged between the measurement unit and the second line.

12. The arrangement as claimed in claim 10, wherein the unit for measuring the fraction is a mass spectrometer.

13. The arrangement as claimed in claim 11, wherein the detection chamber is arranged between the measurement unit and the first line.

14. The arrangement as claimed in claim 11, further comprising:
- a valve arranged in at least one of the first or second lines, the valve supplying the detection chamber with a gas or gas mixture to be supplied to the lens, or with a gas or gas mixture removed from the lens; and
- a pump system for feeding the gas or gas mixture into the detection chamber.

15. The arrangement as claimed in claim 11, wherein the detection chamber has a plurality of sample chambers, the sample chambers being configured to store different samples of gas or gas mixture for carrying out a measurement in the measurement unit.

16. The method as claimed in claim 1, wherein the second measurement is carried out using at least one optical detector.

17. The method as claimed in claim 1, wherein the first and second measurements are carried out using at least one optical detector.

18. The method as claimed in claim 1, wherein the second measurement is carried out using at least one electric sensor.

19. The method as claimed in claim 1, wherein the first and second measurements are carried out using at least one electric sensor.

20. The method as claimed in claim 1, wherein the second measurement is carried out using at least one mass spectrometer.

21. The method as claimed in claim 1, wherein the first and second measurements are carried out using at least one mass spectrometer.

22. The method as claimed in claim 20, wherein removing the gas or gas mixture from the lens, includes taking samples at predetermined time intervals, samples being stored in respective separate chambers, the samples being provided to the mass spectrometer for carrying out the second measurement.

23. The method as claimed in claim 21, wherein removing the gas or gas mixture from the lens, includes taking samples at predetermined time intervals, samples being stored in respective separate chambers, the samples being provided to the mass spectrometer for carrying out the second measurement.

24. The arrangement as claimed in claim 10, wherein the measurement unit comprises a plurality of sensors.

* * * * *